United States Patent
Kaufmann et al.

(10) Patent No.: US 9,933,495 B2
(45) Date of Patent: Apr. 3, 2018

(54) SENSOR DEVICE

(71) Applicant: Micronas GmbH, Freiburg (DE)

(72) Inventors: Timo Kaufmann, Waldkirch-Suggental (DE); Joerg Franke, Freiburg (DE); Andreas Ring, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 453 days.

(21) Appl. No.: 14/674,249

(22) Filed: Mar. 31, 2015

(65) Prior Publication Data

US 2015/0276893 A1 Oct. 1, 2015

(30) Foreign Application Priority Data

Mar. 31, 2014 (DE) .................. 10 2014 004 625

(51) Int. Cl.
| | |
|---|---|
| *G01B 7/14* | (2006.01) |
| *G01R 33/025* | (2006.01) |
| *G01R 33/00* | (2006.01) |
| *G01R 33/07* | (2006.01) |

(52) U.S. Cl.
CPC ....... *G01R 33/025* (2013.01); *G01R 33/0094* (2013.01); *G01R 33/07* (2013.01)

(58) Field of Classification Search
CPC .. G01R 33/025; G01R 33/0094; G01R 33/07; G01R 33/093; G01R 33/0029; G01R 33/02; G01R 33/072; G01R 33/0023; G01B 7/30; G01B 7/14; G01B 7/03; G01D 5/145; G01D 5/147; G01D 11/345; G01P 3/443; G01P 3/448; G01P 3/447; G01P 3/665

USPC .......... 324/173–174, 178–179, 161, 162, 324/207.11–207.25, 259
See application file for complete search history.

(56) References Cited

U.S. PATENT DOCUMENTS

| | | |
|---|---|---|
| 6,288,533 B1 | 9/2001 | Haeberli et al. |
| 8,680,847 B2 | 3/2014 | Franke et al. |
| 8,866,426 B2 | 10/2014 | Franke et al. |
| 9,080,896 B2 | 7/2015 | Wallrafen |
| 2003/0214284 A1 | 11/2003 | Okumura |

(Continued)

FOREIGN PATENT DOCUMENTS

| | | | |
|---|---|---|---|
| DE | 10 2009 042 473 A1 | | 4/2011 |
| EP | 0 986 162 A1 | | 3/2000 |

(Continued)

*Primary Examiner* — Thang Le
(74) *Attorney, Agent, or Firm* — Muncy, Geissler, Olds & Lowe, P.C.

(57) ABSTRACT

A sensor device for suppressing a magnetic stray field, having a semiconductor body, a first pixel cell and a second pixel cell integrated into a surface of the semiconductor body together with a circuit arrangement. Each pixel cell has a first magnetic field sensor and a second magnetic field sensor to detect a magnetic field in the x-direction and a magnetic field in the y-direction. The first pixel cell is spaced apart from the second pixel cell along a connecting line, and the substrate and the semiconductor body are disposed in the same IC package. A magnet is provided that has a planar main extension surface in the direction of an x-y plane and has a magnetization with four magnetic poles in the direction of the x-y plane. The IC package is spaced apart from the main extension surface of the magnet in the z-direction and at least partially within a ring magnet.

13 Claims, 2 Drawing Sheets

(56) References Cited

U.S. PATENT DOCUMENTS

| | | | |
|---|---|---|---|
| 2005/0253578 A1 | 11/2005 | Kawashima et al. | |
| 2007/0029998 A1* | 2/2007 | Popovic | G01R 33/02 324/247 |
| 2008/0231262 A1 | 9/2008 | Wolf et al. | |
| 2009/0033321 A1* | 2/2009 | Kurihara | G01D 5/145 324/207.25 |
| 2010/0156397 A1* | 6/2010 | Yabusaki | G01B 7/30 324/207.2 |
| 2011/0187351 A1 | 8/2011 | Hunger | |
| 2014/0176125 A1* | 6/2014 | Friedrich | G01R 33/0023 324/207.2 |
| 2015/0253156 A1* | 9/2015 | Petrie | G01D 5/145 324/207.2 |
| 2017/0030738 A1* | 2/2017 | Nakamura | G01R 33/07 |

FOREIGN PATENT DOCUMENTS

| | | |
|---|---|---|
| EP | 0 916 074 B1 | 7/2003 |
| EP | 2 107 343 A2 | 10/2009 |
| EP | 2 117 103 B1 | 7/2010 |
| EP | 2 244 070 A1 | 10/2010 |
| EP | 2 354 769 A1 | 8/2011 |
| WO | WO 2010/060607 A1 | 6/2010 |

\* cited by examiner

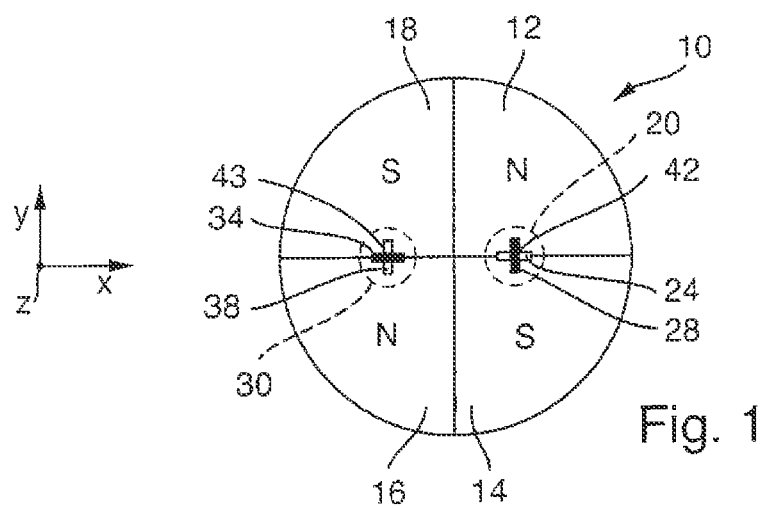
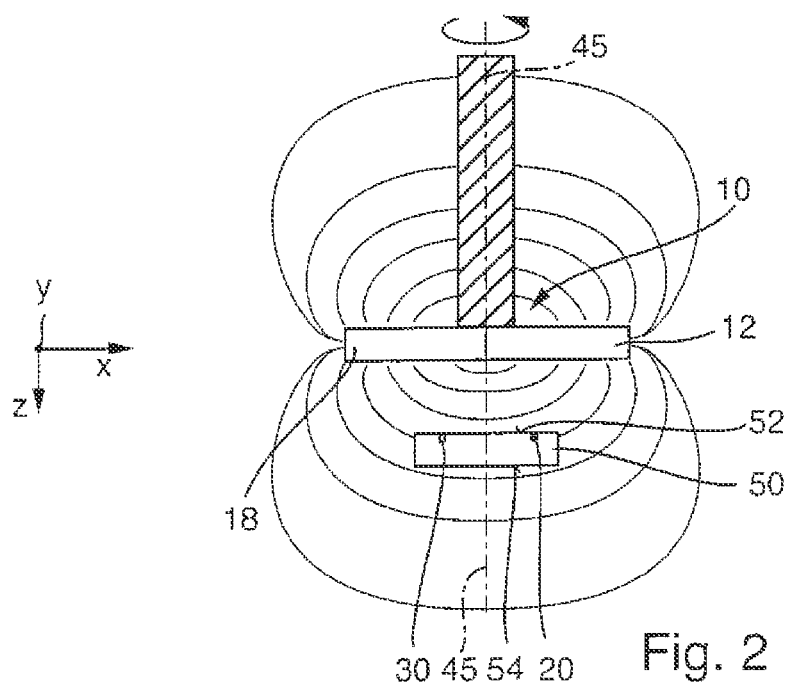

SENSOR DEVICE

This nonprovisional application claims priority under 35 U.S.C. § 119(a) to German Patent Application No. 10 2014 004 625.7, which was filed in Germany on Mar. 31, 2014, and which is herein incorporated by reference.

BACKGROUND OF THE INVENTION

Field of the Invention

The present invention relates to a sensor device.

Description of the Background Art

A sensor device for determining the rotation angle of a shaft is known from EP 0 916 074 B1, which corresponds to U.S. Pat. No. 6,288,533.

Furthermore, an IC package with an integrated circuit and a magnetic sensor is known from WO 2010/060607 A2, which corresponds to U.S. Pat. No. 8,680,847, which is incorporated herein by reference. A permanent magnet whose magnetic flux penetrates the sensor is arranged adjacent to the package.

SUMMARY OF THE INVENTION

On this background, it is therefore an object of the present invention to provide a device that refines the prior art.

According to an embodiment of the invention, a sensor device is provided for suppressing a magnetic stray field, whereby the sensor device has a semiconductor body with a surface, formed in an x-y plane, and a back surface, whereby the x-direction and the y-direction are formed orthogonal to one another, and the semiconductor body or particularly the back surface of the semiconductor body is connected to a substrate, and the sensor device has a first pixel cell and a second pixel cell, whereby both pixel cells are integrated into the surface of the semiconductor body together with a circuit arrangement, and each pixel cell has a first magnetic field sensor and a second magnetic field sensor, and whereby the first magnetic field sensor detects a magnetic field in the x-direction and the second magnetic field sensor a magnetic field in the y-direction, and the first pixel cell is spaced apart from the second pixel cell along a connecting line, and whereby the substrate and the semiconductor body are disposed in the same IC package, and an axis formed in a z-direction is provided, whereby the z-direction is formed orthogonal to the x-y plane, and a magnet is provided, whereby the magnet has a planar main extension surface in the direction of the x-y plane and has a magnetization with four magnetic poles in the direction of the x-y plane, and the surface of the semiconductor body is oriented parallel to the main extension surface of the magnet, and whereby the magnet is mounted rotatable around the z-direction relative to the IC housing, and an imaginary lengthening of the axis penetrates the connecting line in the middle and the magnet in the center of gravity of the main extension surface of the magnet, whereby the IC package is spaced apart from the main extension surface of the magnet in the z-direction, or the magnet is formed as a ring magnet formed in the x-y plane, and the IC package is arranged at least partially within the ring magnet, and the magnetic poles are arranged in the form of segments, and the axis runs through the middle of the ring of the ring magnet.

The arrangement with four magnetic poles can be called a quadrupole arrangement. It can be understood further that a signal, dependent on the strength of the magnetic field, can be induced by the magnet in the magnetic field sensors. Provided that the magnet or the IC package rotates, the signals of the magnetic field sensors have a sinusoidal or cosinusoidal shape.

An advantage of the device of the invention is that both the rotation angle of a stationary axis or particularly a shaft, as well as the rotation angle of a rotating shaft, can be determined by spacing apart two pixel cells with the particular two-dimensional design of the magnetic field sensors in conjunction with the quadrupole arrangement of the magnet. Stated differently, the sensor device can be used for detecting the rotation angle of the shaft. For this purpose, the signals of the magnetic field sensors are processed with a differential evaluation method; i.e., the rotation angle of the shaft can be determined from the signal differences between the first pixel cell and the second pixel cell and from the predetermined magnetic pole arrangement. In particular, in an automatic start-stop system of a motor vehicle, the position of the crankshaft or the position of the camshaft can be determined hereby in the case of an idle engine as well. Turning on of the engine can be made easier by this. A further advantage is that the effects of a stray field, for example, due to the Earth's magnetic field or power cables in electric/hybrid vehicles, which have high currents, for example, above 10 amperes, can be suppressed in a simple and reliable manner by the double design of the magnetic field sensors both in the x-direction and in the y-direction. As a result, the device of the invention can be used for suppressing magnetic DC field components.

In an embodiment, each pixel cell can have a third magnetic field sensor, whereby the third magnetic field sensor detects a magnetic field in the z-direction and, in this case, the z-direction is formed orthogonal to the x-direction and orthogonal to the y-direction, so that each pixel cell is made as a 3-dimensional magnetic field sensor. Tests have shown that it is advantageous to arrange each of the two pixel cells an outer edge of the semiconductor body in order to create hereby a large distance to one another. It is actually shown that the accuracy of the angle determination of the shaft can be increased with an increasing distance between the two pixel cells. In a further refinement, an integrated circuit is formed on the semiconductor body between and/or next to the two pixel cells, whereby the integrated circuit has an electrical functional connection to the two pixel cells. In particular, the magnetic field sensors can be supplied with an operating current with the integrated circuit and can evaluate the signal induced by the applied magnetic field.

In an embodiment, the pixel cell and the magnetic field sensors in the pixel cell can have a common center of gravity in order to determine the magnetic flux at the same point of each pixel cell. The particular common center of gravity in the present case is understood as the intersection point of the two magnetic field sensors in one of the pixel cells. It should be understood that the intersection point lies in the middle of the particular magnetic field sensor; i.e., the remaining lengths of the particular sensor are equally long on both sides of the intersection point. In a refinement, the magnetic field sensors each have a main extension surface, whereby the main extension surfaces of the magnetic field sensors are formed orthogonal to one another or in pairs at right angles to one another.

Tests have shown that it is advantageous to configure the magnetic field sensors as Hall sensors formed orthogonal to one another and, in this case, to arrange two of the Hall sensors as vertical Hall sensors; i.e., the main extension surface of the two vertical Hall sensors is each configured perpendicular to the surface of the semiconductor body. It is preferred in particular to make the Hall sensors in each case as Hall plates.

In a further embodiment, the magnet can be formed as a circle in the x-y plane, whereby the radius of the circle is greater than half the length of the connecting line or, provided the magnet is not configured as a ring magnet, the magnet is configured as a square and half of the diagonal of the square is greater than half the length of the connecting line. As a result, the pixel cells, in a projection along an imaginary extension in the z-direction, are covered by the surface of the magnet and the sensitivity of the device is increased. It is advantageous in particular to make the magnetic poles as four equally large segments of a circle.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

The invention will be described in greater detail below with reference to the drawings. In this respect, similar parts are labeled with identical designations. The illustrated embodiments are highly schematized; i.e., the distances and the lateral and vertical extensions are not to scale and, if not otherwise indicated, also do not have any derivable geometric relations to one another. In the drawing:

FIG. 1 shows a top plan view of a magnet with four magnetic poles;

FIG. 2 shows a cut along an axis in a z-direction;

FIG. 3b shows a cut through the ring magnet shown in the illustration in FIG. 3a.

DETAILED DESCRIPTION

Figure 3A:
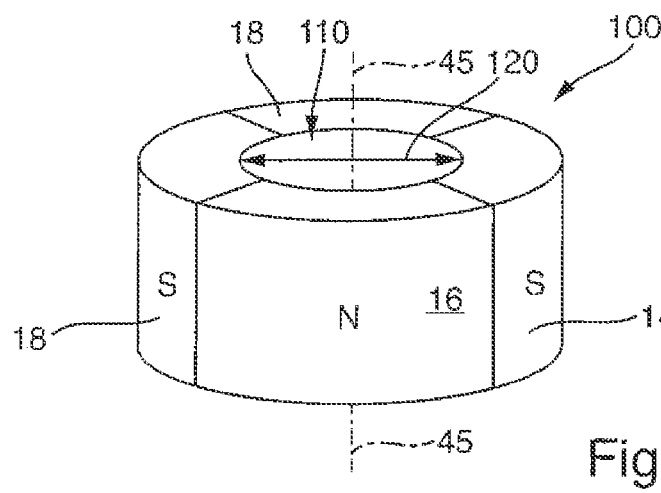
FIG. 3a shows a perspective view of a ring magnet along an axis in a z-direction.

The illustration in FIG. 1 shows a top plan view of a magnet 10 with four magnetic poles 12, 14, 16, 18, whereby the individual circle segments of the magnetic poles are made equal in size. It is understood that in the case of the four magnetic poles 12, 14, 16, and 18 two magnetic poles 12 and 16 each are formed as north poles and the two other magnetic poles 14 and 18 as south poles. Furthermore, a first pixel cell 20 is configured with a first magnetic field sensor 24 formed in an x-direction and with a second magnetic field sensor 28 formed in a y-direction, and a second pixel cell 30 is configured with a first magnetic field sensor 34 formed in the x-direction and a second magnetic field sensor 38 formed in the y-direction. First magnetic field sensors 24 and 34 are formed orthogonal to the respective second magnetic field sensors 28 and 38 and have a first center of gravity 42 formed in first pixel cell 20 and another first center of gravity 43 formed in second pixel cell 30.

The Hall plates each have a main extension surface formed in a z-direction, whereby in the illustrated x-y plane only a projection onto a narrow side surface of the Hall plate is visible. First pixel cell 20 and second pixel cell 30 are formed in the surface of a semiconductor body. For reasons of clarity, the semiconductor body is not shown in the present case, however.

A cut along an axis 45 is shown in the illustration in FIG. 2. Axis 45 in the present case is configured as a shaft in the z-direction. Only the differences from the illustration in FIG. 1 will be explained below. In the present case, magnet 10 is arranged on a face side of a shaft. In an imaginary extension, the longitudinal axis of the shaft or axis 45 passes through magnet 10 and a semiconductor body 50. Semiconductor body 50 has a surface 52 and a back surface 54. Semiconductor body 50 is spaced apart from magnet 10 in the direction of the longitudinal axis. Pixel cells 20 and 30 are formed on surface 52 and spaced apart from one another. An integrated circuit (not shown) is formed on surface 52 of semiconductor body 50 between first pixel cell 20 and second pixel cell 30. Semiconductor body 50 is disposed in an IC package.

As soon as the shaft with magnet 10 rotates, a Hall voltage is induced in the Hall plates, provided an operating current flows through the Hall plates.

Figure 3B:
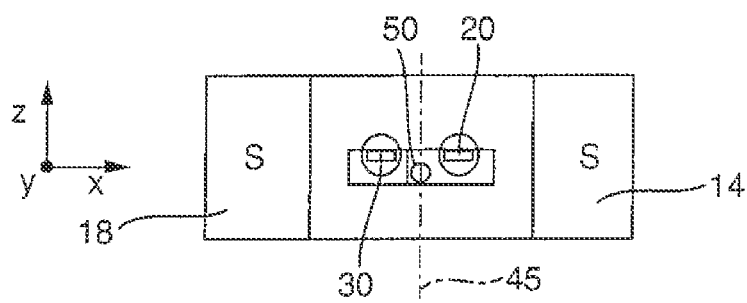

In the illustration of FIG. 3a, a perspective view of a magnet 10 configured as ring magnet 100 is shown along axis 45 in the z-direction. Further, a sectional illustration through ring magnet 100 according to the illustration of FIG. 3a is shown in FIG. 3b. Only the differences to the preceding figures will be described below. In the present case, the four magnetic poles 12, 14, 16, and 18 are configured as circle segments of ring magnet 100. In the middle, ring magnet 100 has a hole 110 with a diameter 120; i.e., the shape of ring magnet 100 is comparable to a short hollow cylinder formed in the z-direction, whereby however the magnetization changes in the main extension plane, i.e., in the x-y plane. It should be noted that in an embodiment that is not shown, ring magnet 100 is also flange-mounted to the face side of a shaft.

The illustration in FIG. 3b shows that the IC package with semiconductor body 50 is disposed in hole 110. It is evident that in a cut in the z-direction through the center point of ring magnet 100 the two circle segments opposite to one another have the same magnetization pairwise. In the present case, the two south poles 14 and 18 are opposite to one another. It is understood that both the ring magnet and the IC package can be rotated against one another around axis 45.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A sensor device for suppressing a magnetic stray field, the sensor device comprising:

a semiconductor body with a surface formed in an x-y plane and a back surface, an x-direction and a y-direction being formed orthogonal to one another, the semiconductor body being arranged on a substrate, the substrate and the semiconductor body being disposed in an IC package;

a first pixel cell and a second pixel cell, the first and second pixel cells being formed in the surface of the semiconductor body together with a circuit arrangement, each of the first and second pixel cells having a first magnetic field sensor and a second magnetic field sensor, the first magnetic field sensor detecting a magnetic field in the x-direction and the second magnetic field sensor detecting a magnetic field in the y-direction, the first pixel cell being spaced apart from the second pixel cell along a connecting line;

an axis formed in a z-direction, the z-direction being configured orthogonal to the x-y plane; and a magnet having a planar main extension surface in the direction of the x-y plane and having a magnetization with four magnetic poles in the direction of the x-y plane, the surface of the semiconductor body being oriented parallel to the main extension surface of the magnet;

wherein the magnet is mounted rotatable around the z-direction relative to an IC housing of the IC package, and an imagined lengthening of the axis penetrates the connecting line in the middle and penetrates the magnet in a center of gravity of a main extension surface of the magnet; and wherein the IC package is spaced apart from the main extension surface of the magnet in a z-direction, or wherein the magnet is configured as a ring magnet formed in the x-y plane and the IC package is arranged at least partially within the ring magnet, wherein the four magnetic poles are arranged as segments, and wherein the axis runs through a middle of a ring of the ring magnet.

2. The sensor device according to claim 1, wherein each pixel cell comprises a third magnetic field sensor, wherein the third magnetic field sensor detects a magnetic field in the z-direction, and wherein the z-direction is configured orthogonal to the x-direction and orthogonal to the y-direction so that each pixel cell is formed as a 3-dimensional magnetic field sensor.

3. The sensor device according to claim 1, wherein the first and second pixel cells are each formed near an outer edge of the semiconductor body to form a large distance to one another.

4. The sensor device according to claim 1, wherein an integrated circuit is formed on the semiconductor body between and/or next to the first and second pixel cells, and wherein the integrated circuit has an electrical functional connection to the first and second pixel cells.

5. The sensor device according to claim 1, wherein the first and second magnetic field sensors in the first pixel cell and the magnetic field sensors in the second pixel cell have a common center of gravity in order to determine a magnetic flux at a same point of each pixel cell.

6. The sensor device according to claim 1, wherein the first and second magnetic field sensors each have a main extension surface, and wherein the main extension surfaces of the magnetic field sensors are formed in pairs at right angles to one another.

7. The sensor device according to claim 6, wherein the first and second magnetic field sensors are formed as Hall sensors, wherein two of the Hall sensors are formed as vertical Hall sensors, and wherein the main extension surface of each of the two vertical Hall sensors is formed substantially perpendicular to the surface of the semiconductor body.

8. The sensor device according to claim 2, wherein the third magnetic field sensor of each of the first or second pixel cell is configured as a Hall plate.

9. The sensor device according to claim 1, wherein the magnet is configured as a circle in the x-y plane, wherein a radius of the circle is greater than half the length of the connecting line or, wherein, provided the magnet is not configured as a ring magnet, the magnet is formed as a square and half of the diagonal of the square is greater than half the length of the connecting line.

10. The sensor device according to claim 1, wherein the magnetic poles are formed as four equally large segments of a circle.

11. The sensor device according to claim 1, wherein the sensor device detects a rotation angle of a magnet connected to the axis or to a shaft.

12. The sensor device according to claim 1, wherein the sensor device determines a rotation angle in a case of the rotation angle of the magnet connected to a stationary axis or to a shaft.

13. The sensor device according claim 1, wherein the sensor device is configured for a differential operation for detecting the rotation angle of an axis and a shaft.

* * * * *